(12) United States Patent
Lay

(10) Patent No.: US 11,462,548 B1
(45) Date of Patent: Oct. 4, 2022

(54) SEMICONDCUTOR DEVICE AND MANUFACTURING METHOD THEREOF

(71) Applicant: NANYA TECHNOLOGY CORPORATION, New Taipei (TW)

(72) Inventor: Chao-Wen Lay, Miaoli County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/355,142

(22) Filed: Jun. 22, 2021

(51) Int. Cl.
*H01L 27/108* (2006.01)

(52) U.S. Cl.
CPC .. *H01L 27/10885* (2013.01); *H01L 27/10805* (2013.01)

(58) Field of Classification Search
CPC ................ H01L 27/10885; H01L 27/10805
See application file for complete search history.

(56) References Cited

U.S. PATENT DOCUMENTS

2020/0343379 A1* 10/2020 Sharma ................. H01L 29/458

* cited by examiner

*Primary Examiner* — Mohammed R Alam
(74) *Attorney, Agent, or Firm* — CKC & Partners Co., LLC

(57) ABSTRACT

A semiconductor device includes a semiconductor structure, a first dielectric layer and a plurality of multilayer stacks. The semiconductor structure includes conductive features therein. The first dielectric layer is on the semiconductor structure. The multilayer stacks are arranged on the first dielectric layer. Each of the multilayer stacks comprises a semiconductor layer over the first dielectric layer, a conductive layer over the semiconductor layer and a second dielectric layer over the conductive layer. The second dielectric layer includes a top portion and a bottom portion wider than the top portion.

17 Claims, 17 Drawing Sheets

SEMICONDCUTOR DEVICE AND MANUFACTURING METHOD THEREOF

BACKGROUND

Field of Disclosure

The present disclosure relates to a semiconductor device and a manufacturing method thereof. More particularly, the present disclosure relates to a semiconductor device including a contact and manufacturing methods thereof.

Description of Related Art

A variety of semiconductor memory devices are used extensively in many consumer products. Illustrative examples of such memory devices include dynamic random access memory (DRAM) and flash memory devices. As the semiconductor technology has progressed into nanoscale technology, the sizes of the semiconductor memory devices and the components therein are gradually reduced. It is desirable to provide improved contact structures that can be disposed within a memory array for being connected to active regions.

SUMMARY

In accordance with some embodiments of the present disclosure, a semiconductor device includes a semiconductor structure, a first dielectric layer and a plurality of multilayer stacks. The semiconductor structure includes conductive features therein. The first dielectric layer is on the semiconductor structure. The multilayer stacks are arranged on the first dielectric layer. Each of the multilayer stacks comprises a semiconductor layer over the first dielectric layer, a conductive layer over the semiconductor layer and a second dielectric layer over the conductive layer. The second dielectric layer includes a top portion and a bottom portion wider than the top portion.

In accordance with some embodiments of the present disclosure, a width of the top portion of the second dielectric layer is 40% to 70% of a width of the bottom portion of the dielectric layer.

In accordance with some embodiments of the present disclosure, the semiconductor device further includes a contact between two of the multilayer stacks.

In accordance with some embodiments of the present disclosure, the contact penetrates the first dielectric layer and is in contact with one of the conductive features.

In accordance with some embodiments of the present disclosure, the contact includes tungsten.

In accordance with some embodiments of the present disclosure, the contact includes a bottom portion including poly-crystalline silicon and a top portion including tungsten.

In accordance with some embodiments of the present disclosure, the contact is in contact with the top portion of the second dielectric layer.

In accordance with some embodiments of the present disclosure, the semiconductor device further includes spacers along sidewalls of the multilayer stacks.

In accordance with some embodiments of the present disclosure, top surfaces of the spacers are lower than a top surface of the second dielectric layer and higher than a top surface of the conductive layer.

In accordance with some embodiments of the present disclosure, the spacers are in contact with a top surface of the bottom portion of the second dielectric layer.

In accordance with some embodiments of the present disclosure, a manufacturing method of a semiconductor structure includes forming a first dielectric layer over a semiconductor structure including a conductive feature. A semiconductor layer, a conductive layer, and a second dielectric layer are sequentially formed on the first dielectric layer. A patterned resist layer is formed on the second dielectric layer. The second dielectric layer, the conductive layer and the semiconductor layer are patterned by using the patterned resist layer as an etching mask to form multilayer stacks. Each of the multilayer stacks includes a patterned semiconductor layer, a patterned conductive layer and a patterned second dielectric layer from bottom to top. An etching process is performed to laterally etch a portion of the patterned second dielectric layer such that a width of a top portion of the etched second dielectric layer is less than a width of a bottom portion of the patterned second dielectric layer.

In accordance with some embodiments of the present disclosure, performing the etching process to laterally etching the portion of the patterned second dielectric layer includes forming a first spacer layer over the semiconductor structure and the multilayer stacks. The first spacer layer is etched back to expose the portion of the patterned second dielectric layer. After etching back the first spacer layer, the portion of the patterned second dielectric layer is laterally etched to form the top portion of the etched second dielectric layer and the bottom portion of the patterned second dielectric layer.

In accordance with some embodiments of the present disclosure, etching back the spacer layer includes etching the spacer layer to a height lower than a top surface of the patterned second dielectric layer and higher than a top surface of the patterned conductive layer.

In accordance with some embodiments of the present disclosure, portions of the first dielectric layer are etched to expose the conductive features in the semiconductor structure during etching back the spacer layer.

In accordance with some embodiments of the present disclosure, the manufacturing method further includes forming contacts between the multilayer stacks after laterally etching the portion of the patterned second dielectric layer.

In accordance with some embodiments of the present disclosure, forming the contacts includes filling a first material in a trench between the multilayer stacks. The first material is etched back. A second material is filled in the trench and on the etched first material.

In accordance with some embodiments of the present disclosure, etching back the spacer layer to expose the portion of the patterned second dielectric layer includes forming a sacrificial layer in a trench between the multilayer stacks, wherein a top surface of the sacrificial layer is higher than a top surface of the patterned conductive layer and lower than a top surface of the patterned second dielectric layer. A top portion of the spacer layer exposed from the sacrificial layer is etched. The sacrificial layer is removed after etching the top portion of the spacer layer.

In accordance with some embodiments of the present disclosure, the manufacturing method further includes removing the first spacer layer after laterally etching the patterned second dielectric layer. A second spacer layer is conformally formed on the multilayer stacks and the first dielectric layer. The second spacer layer and the first dielectric layer are etched to expose the conductive feature in the semiconductor structure.

In accordance with some embodiments of the present disclosure, the manufacturing method further includes removing the patterned resist layer after performing the etching process.

In accordance with some embodiments of the present disclosure, the etching process to etch the patterned second dielectric layer is performed by using an isotropic etching process.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
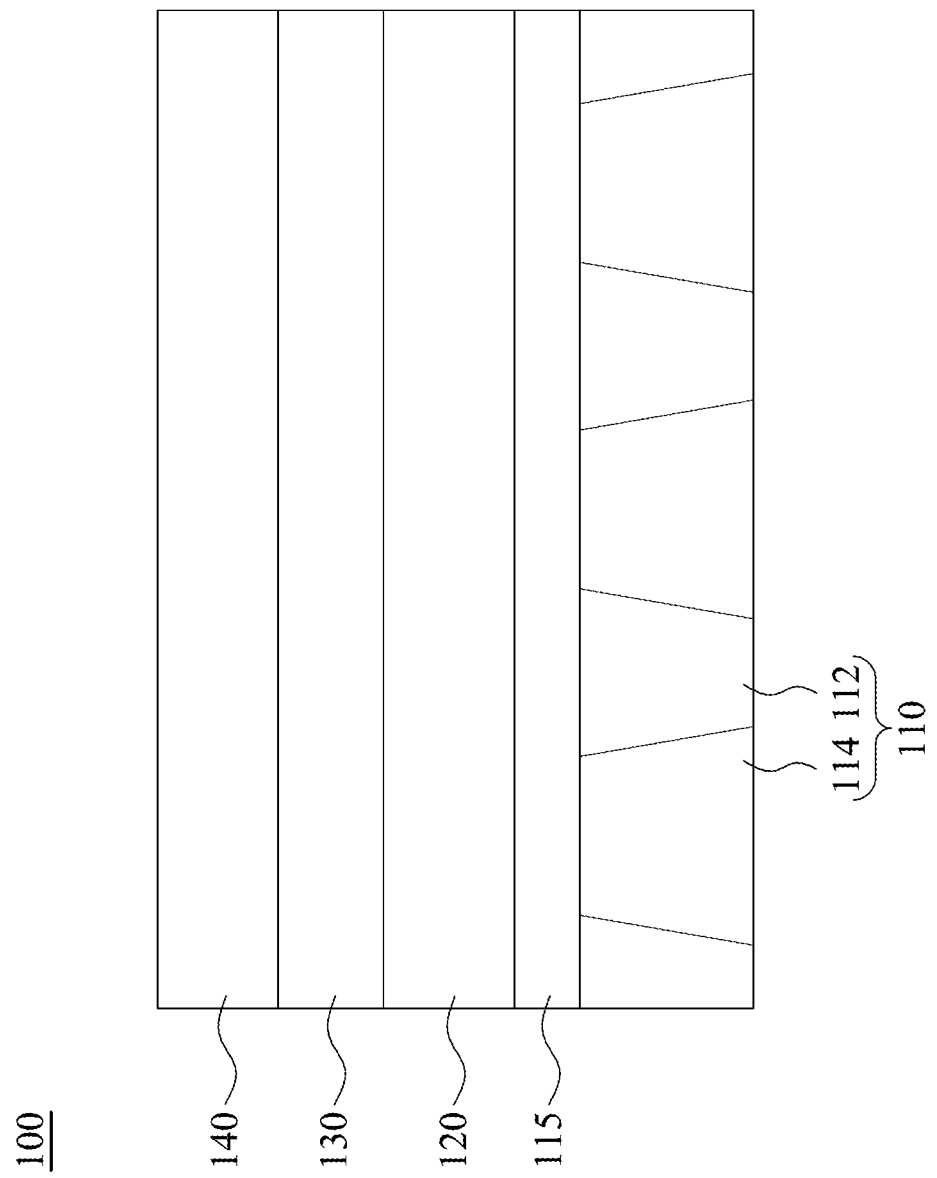
FIGS. 1-8 illustrate cross-sectional views of intermediate stages in the manufacturing process of a semiconductor device in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Embodiments of the present disclosure can reduce the difficulties of forming contacts in a semiconductor device. More specifically, trenches, which are between bitlines, for forming contacts in the embodiments of the present disclosure have wide top portions and low aspect ratio, making the contacts form in the trenches easily. Also, the thickness of components of the bitlines, such as a hard mask, will not be reduced, so each component of the bitlines function well with the configuration disclosed herein. In some embodiments, the semiconductor devices of the embodiments are dynamic random access memory (DRAM) devices.

FIGS. 1-7 illustrate cross-sectional views of intermediate stages in the manufacturing process of a semiconductor device 100 in accordance with some embodiments of the present disclosure. Referring to FIG. 1, a semiconductor structure 110 is provided. The semiconductor structure 110 includes conductive features 112 and isolation structures 114 between the conductive features 112. The conductive features 112 may be any suitable components, such as active regions of the semiconductor device, or the like. The isolation structures 114 may be shallow trench isolation (STI) structures in some embodiments. In some embodiments, the conductive features 112 are made of silicon. The isolation structures 114 may be dielectric materials to electrically isolate the conductive features 112. In some embodiments, the conductive features 112 and the isolation structures 114 are disposed over a substrate.

A first dielectric layer 115, a semiconductor layer 120, a conductive layer 130 and a second dielectric layer 140 are sequentially formed from bottom to top over the semiconductor structure 110. Therefore, the semiconductor layer 120 is over the first dielectric layer 115, the conductive layer 130 is over the semiconductor layer 120, and the second dielectric layer 140 is over the conductive layer 130. In some embodiments, the first dielectric layer 115 includes oxides, e.g., silicon oxide. The semiconductor layer 120 may include any suitable semiconductor materials. In some embodiments, the semiconductor layer 120 includes semiconductive materials, e.g., poly crystalline silicon. The conductive layer 130 may include any suitable conductive materials, such as metals. In some embodiments, the conductive layer 130 includes tungsten. The second dielectric layer 140 may include any suitable dielectric materials. In some embodiments, the second dielectric layer 140 includes nitrides, e.g., silicon nitride. The semiconductor layer 120, the conductive layer 130 and the second dielectric layer 140 may be formed by any suitable process, such as physical vapor deposition (PVD), chemical vapor deposition (CVD), atomic layer deposition (ALD) or the like.

Figure 2:
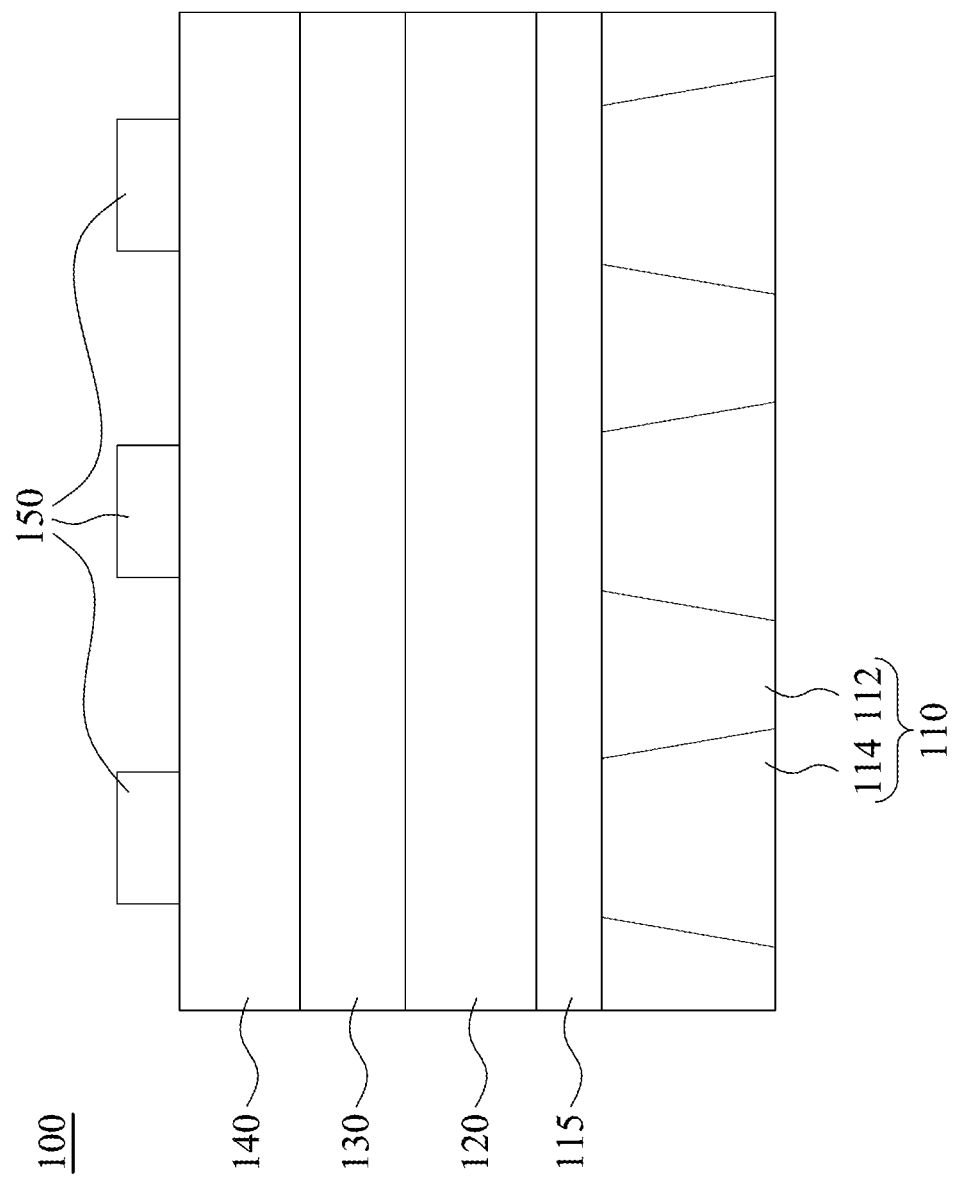

Referring to FIG. 2, a patterned resist layer 150 is formed over the second dielectric layer 140. Discussed in greater detail, the patterned resist layer 150 may be formed by the following process. A resist layer is formed over the second dielectric layer 140 using suitable process (such as spin-on coating). Subsequently, an exposure source is used to expose the resist layer with a reticle. After the exposure, the resist layer is developed to form a pattern therein. Different patterns may be chosen for different usages. For examples, a pattern with multiple stripes may be used to form bitlines in the semiconductor device. After development, the patterned resist layer 150 is formed. In some embodiments, the patterned resist layer 150 is a carbon-containing layer.

Figure 3:
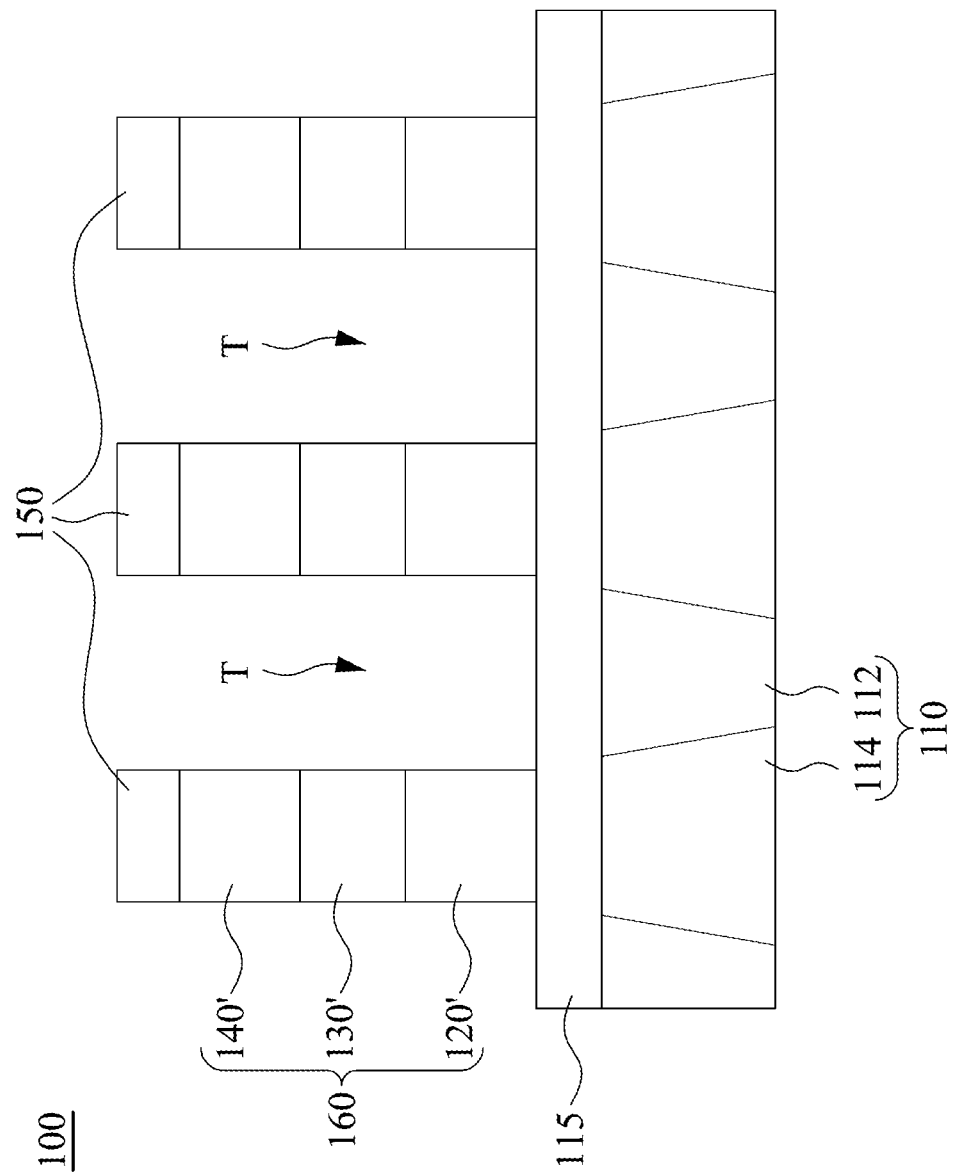

Referring to FIG. 3, the second dielectric layer 140, the conductive layer 130 and the semiconductor layer 120 are sequentially patterned by using the patterned resist layer 150 as an etching mask to form a patterned second dielectric layer 140', a patterned conductive layer 130' and a patterned semiconductor layer 120'. The patterned second dielectric layer 140', the patterned conductive layer 130' and the patterned semiconductor layer 120' are together referred to a multilayer stack 160 herein, and the multilayer stack 160 are used as the bitlines in the semiconductor device. The patterned semiconductor layer 120' and the patterned conductive layer 130' serve as conductive portions of the bitlines to electrically connect different components, and the patterned second dielectric layer 140' serves as a hard mask of the bitlines to prevent the underlying patterned conductive layer 130' from damage resulting from the patterning process. The second dielectric layer 140, the conductive layer 130 and the semiconductor layer 120 may be patterned by any suitable process, such as etching including dry etching and wet etching. After patterning the second dielectric layer 140, the conductive layer 130 and the semiconductor layer 120, multiple multilayer stacks 160 with trenches T therebetween are arranged over the first dielectric layer 115 and the semiconductor structure 110.

Figure 4:
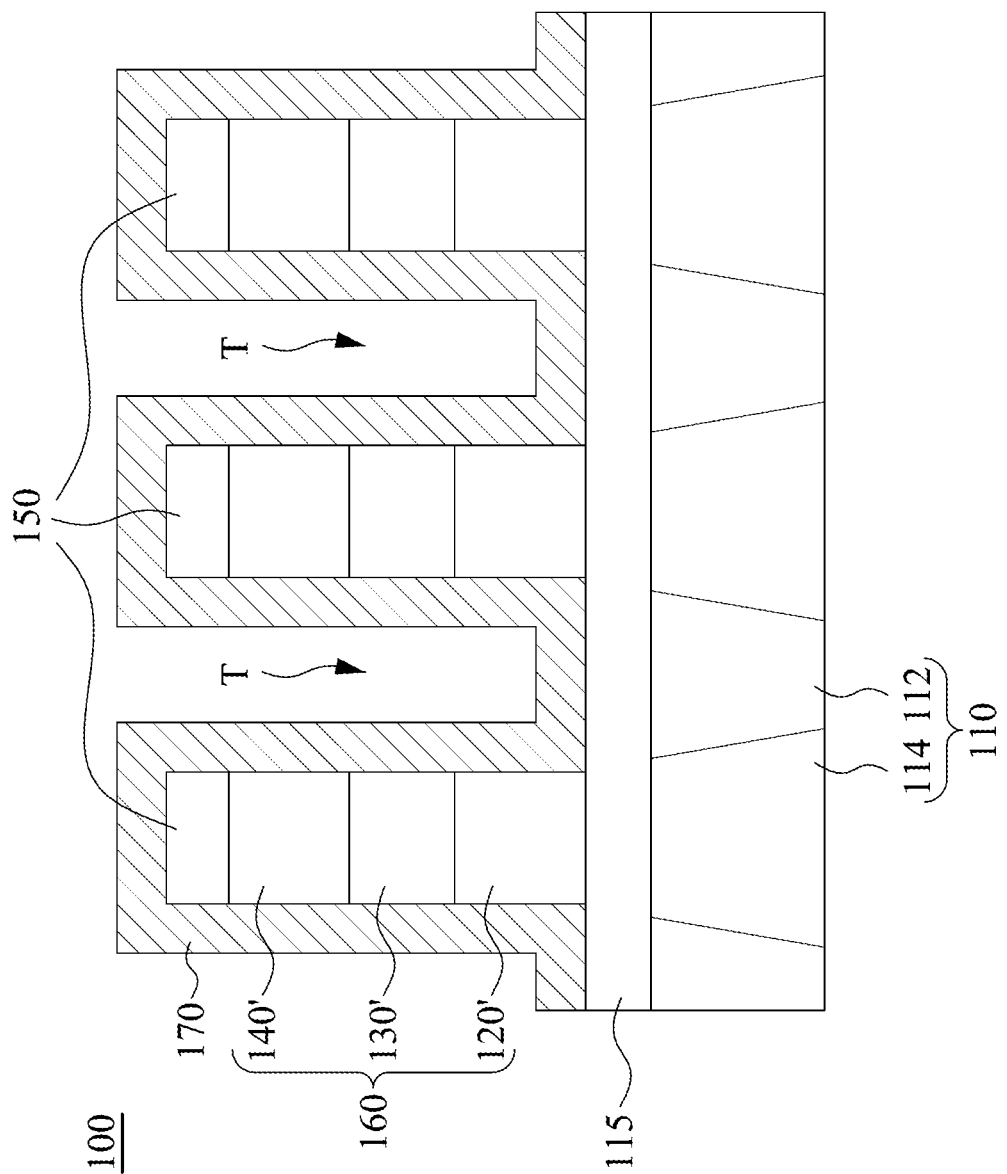

Referring to FIG. 4, a first spacer layer 170 is conformally formed over the semiconductor structure 110 and the multilayer stacks 160. The first spacer layer 170 is formed by depositing an oxide layer at a low temperature. In some embodiments, the deposition process of the oxide layer is performed at the temperature in a range from about 25° C. to about 75° C. If the deposition process is performed outside the disclosed temperature range, the bitlines may be damaged. In some embodiments, the first spacer layer 170 is deposited by ALD. In some embodiments, the thickness of the first spacer layer 170 is in a range of about 6 nm to about 8 nm.

Figure 5:
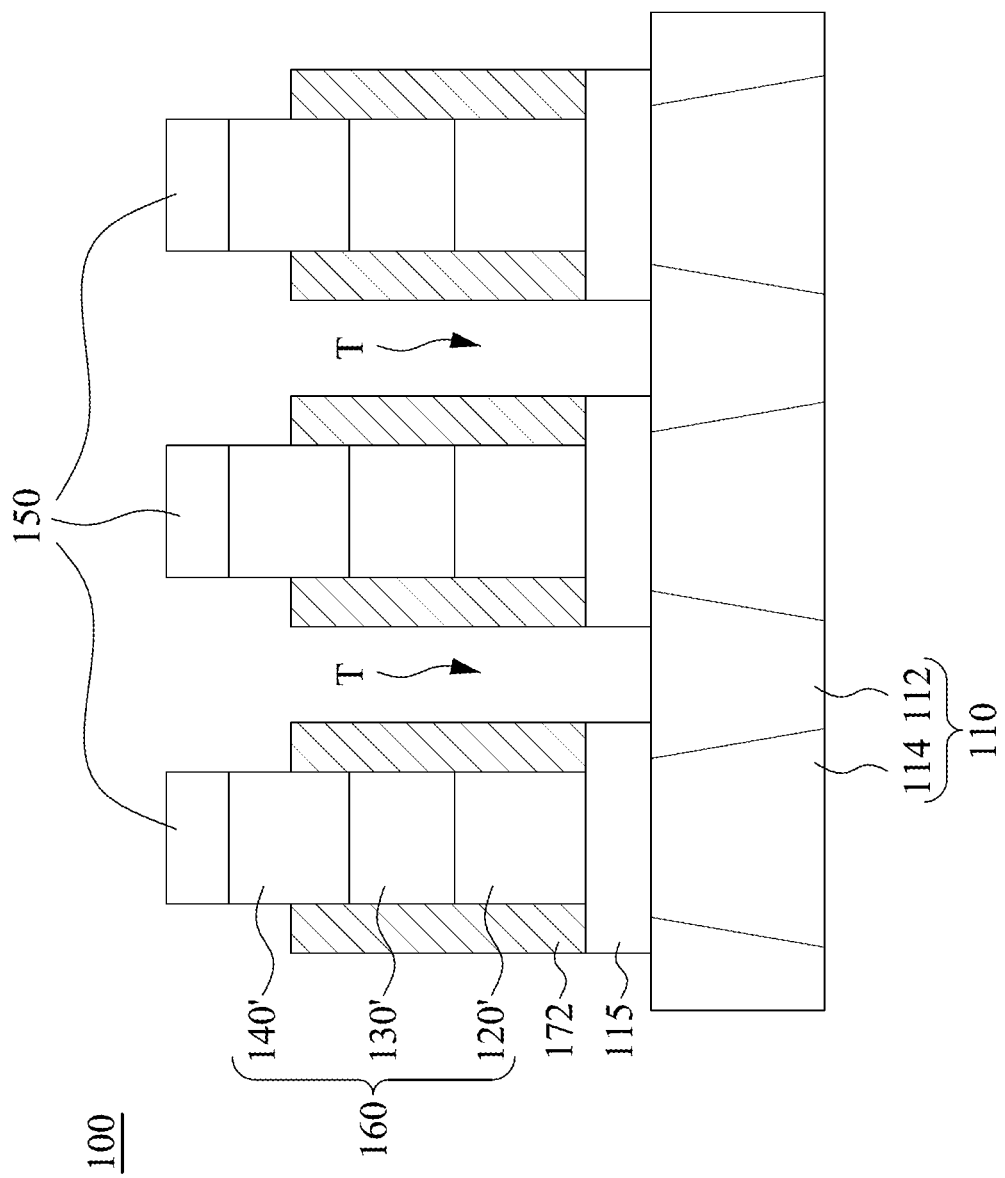

Referring to FIG. 5, portions of the first spacer layer 170 on the top surfaces of the multilayer stacks 160 are removed and portions of the first spacer layer 170 adjacent to sidewalls of the multilayer stacks 160 are etched back to form first spacers 172 along the sidewalls of the multilayer stacks 160. Each of the first spacers 172 has a top surface higher than the top surface of the patterned conductive layer 130' and lower than the top surface of the patterned second dielectric layer 140'. The first spacers 172 cover sidewalls of the patterned conductive layer 130' and the patterned semiconductor layer 120' to isolate the patterned conductive layer 130' and the patterned semiconductor layer 120' from the subsequently formed contacts and expose portions of the patterned second dielectric layer 140'. In some embodiments, after etching back the first spacer layer 170, a portion of the patterned second dielectric layer 140' exposed from the first spacers 172 accounts for about 20% to about 50% of the overall patterned second dielectric layer 140'.

In addition, portions of the first spacer layer 170 on the surface of the semiconductor structure 110 and the underlying first dielectric layer 115 are removed in this process. Stated another way, the portions of the first spacer layer 170 and the first dielectric layer 115 at the bottom of the trenches T are etched to expose the conductive features 112.

Figure 6:
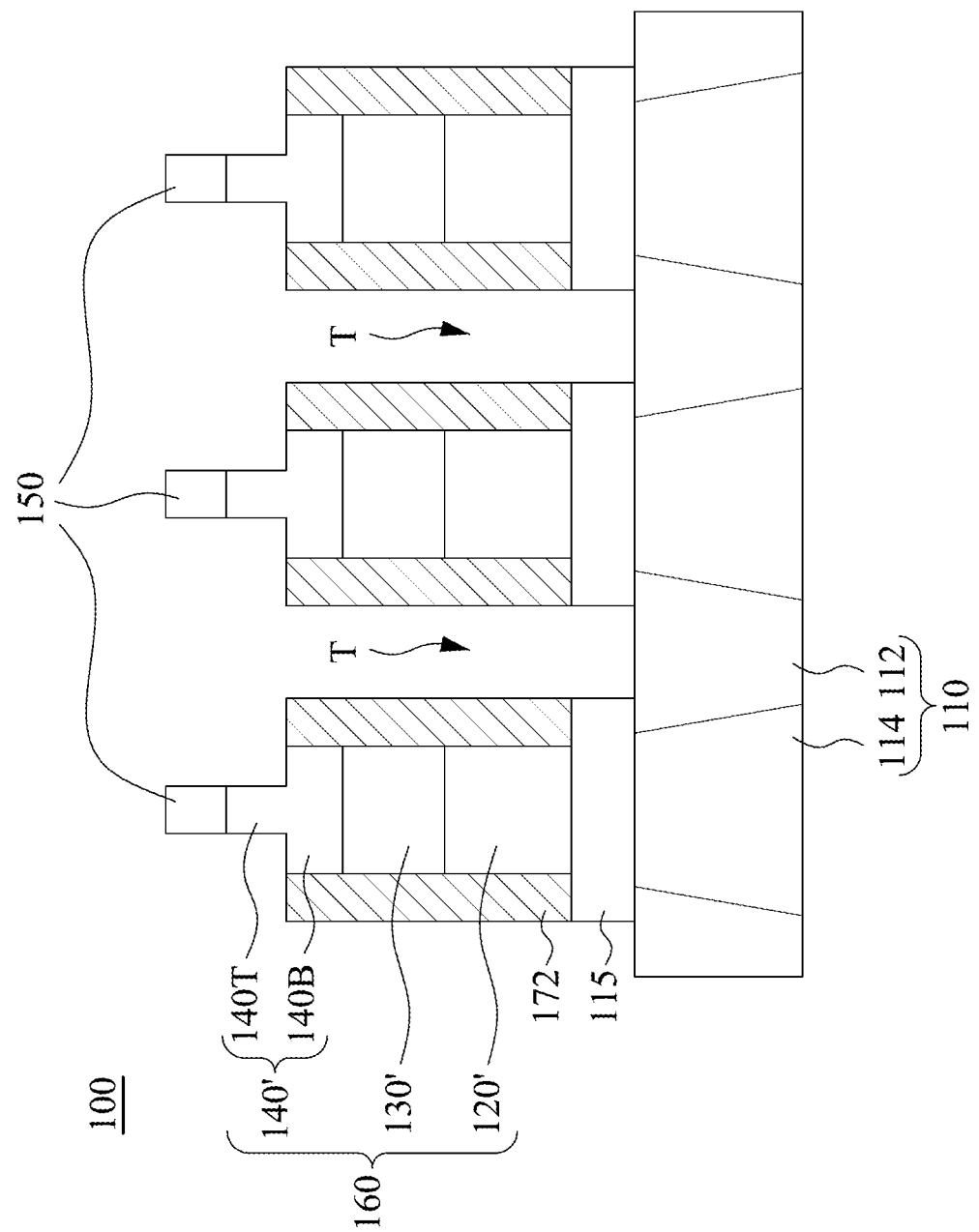

Referring to FIG. 6, the patterned second dielectric layers 140' are laterally etched by using the first spacers 172 as masks to form a top portion 140T and a bottom portion 140B in each of the patterned second dielectric layers 140'. Discussed in greater detail, the top portion 140T of the patterned second dielectric layer 140' protrudes from the first spacers 172. Therefore, the top portion 140T is laterally etched. On the other hand, sidewalls of the bottom portion 140B are covered by the first spacers 172; therefore, the bottom portion 140B will not be etched in this operation. As the result of the lateral etching process, the bottom portion 140B has a width wider than that of the top portion 140T. The narrower top portion 140T makes top portions of the trenches T between the adjacent multilayer stacks 160 become wider and reduce the aspect ratio of the trenches T. In this embodiment, although the aspect ratio of the trenches T is reduced, the thickness of the patterned second dielectric layer 140' is not reduced. In the subsequent process, it is easy to form contacts in the trenches T with the wide top portions; for example, the subsequently formed contacts may be formed with less voids. In addition, the patterned second dielectric layer 140' as the hard mask still remains at the same thickness, so the patterned second dielectric layer 140' still functions well in the bitlines.

In some embodiments, a width of the top portion 140T is in a range of about 40% to about 70% of the bottom portion 140B. If the width of the top portion 140T is outside the disclosed range, the aspect ratio of the trenches T may not be low enough to reduce the difficulty of forming contacts or the patterned second dielectric layer 140' as the hard mask may not function well during the etching process. In some embodiments, the lateral etching process is an isotropic etching process. In some embodiments, a portion of the patterned resist layer 150 is also etched from the top in the lateral etching process.

Figure 7:
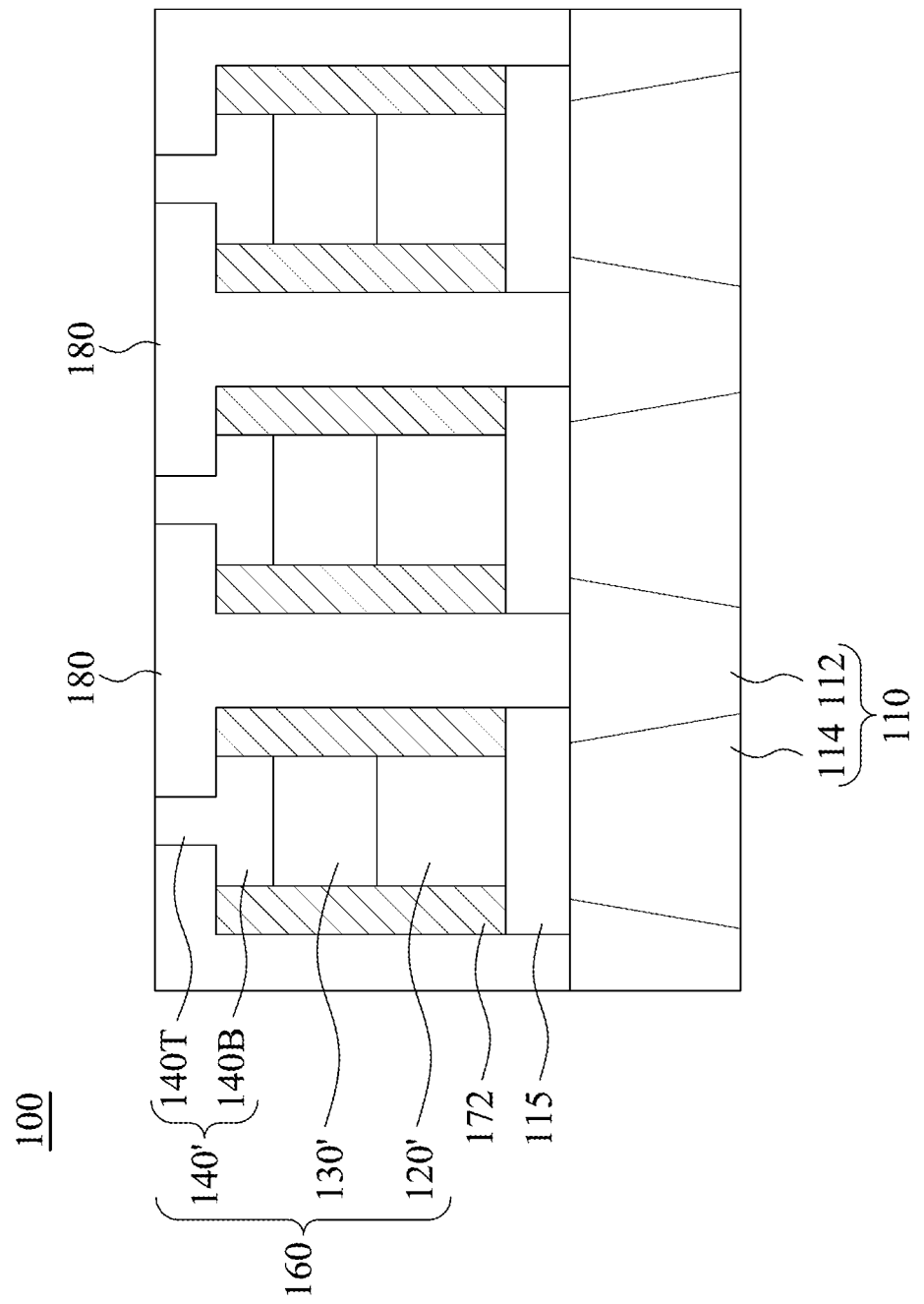

Referring to FIG. 7, contacts 180 are formed in the trenches T between the adjacent multilayer stacks 160. The contacts 180 penetrate the first dielectric layer 115 and are in contact with the conductive features 112 to provide electrical connection between the conductive features 112 and the components above the contacts 180. The contacts 180 may be made of any suitable conductive materials (such as metals) or semiconductor materials or combinations thereof. In some embodiments, the contacts 180 include a single conductive material such as metals. In some other embodiments, the contacts 180 are made of W, Cu or the like.

Figure 8:
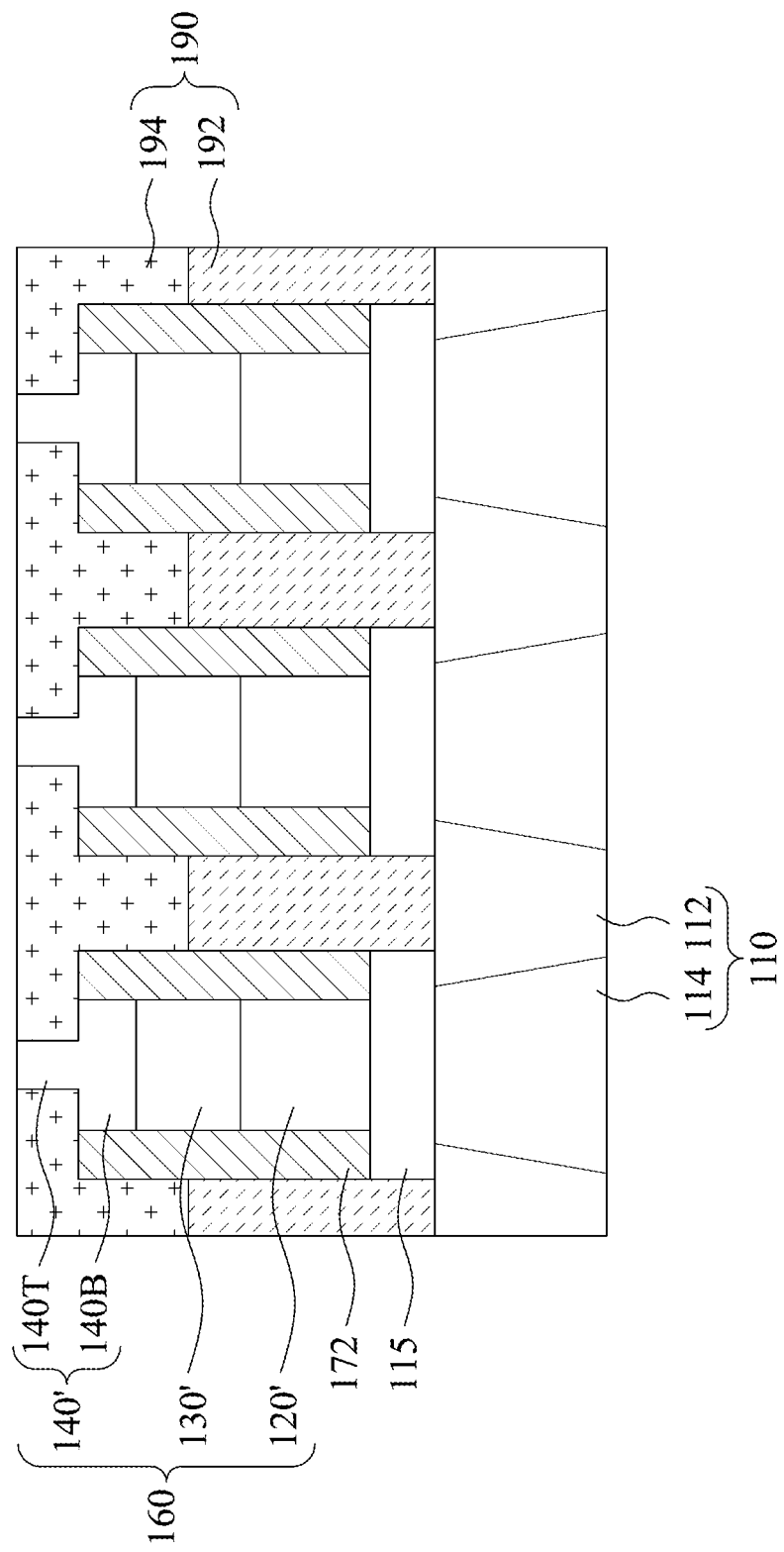

In some embodiments, the contacts may be made of two or more conductive or semiconductor materials, such as contacts 190 shown in FIG. 8. A first material may be filled in the trenches T between the multilayer stacks 160 first, followed by etching back the first material to form a bottom portion 192 of the contacts 190. A second material is then filled over the bottom portion 192 to form a top portion 194. Accordingly, the contacts 190 with two different materials are formed. The bottom portion 192 and the top portion 194 may be any suitable conductive materials (such as metals) or semiconductor materials or combinations thereof. In some embodiments, the bottom portion 192 includes poly-crystalline silicon, and the top portion 194 includes tungsten. With the wide top portion of the trenches T in these embodiments, the contacts 180 and 190 are easily formed, and void issues in the contacts 180 and 190 can be improved. In some embodiments shown as FIG. 7 and FIG. 8, the contacts 180 and the contacts 190 are in contact with the top portion 140T of the patterned second dielectric layer 140' in the multilayer stacks 160.

Figure 9:
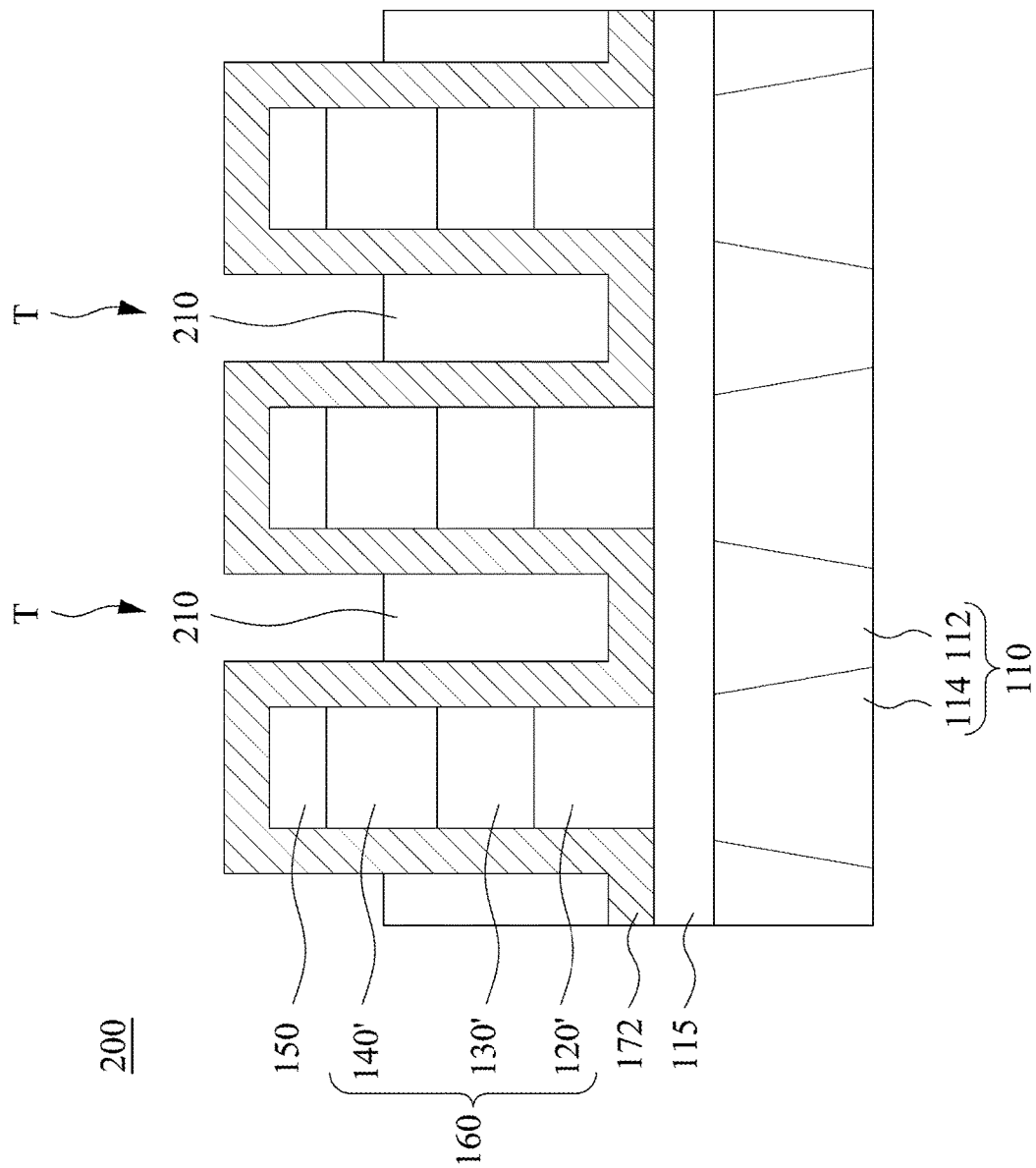
FIGS. 9-17 illustrate cross-sectional views of intermediate stages in the manufacturing process of a semiconductor device in accordance with other embodiments of the present disclosure.

FIGS. 9-17 illustrate cross-sectional views of intermediate stages in the manufacturing process of a semiconductor device 200 in accordance with other embodiments of the present disclosure. After the manufacturing process in FIGS. 1-4, a sacrificial layer 210 is formed in the trenches T between the adjacent multilayer stacks 160, as shown in FIG. 9. The sacrificial layer 210 has a top surface higher than the top surface of the patterned conductive layer 130' and lower than the top surface of the patterned second dielectric layer 140'. The sacrificial layer 210 may be formed by any suitable process, such as PVD, CVD or the like. In some embodiments, the sacrificial layer 210 is made of poly-crystalline silicon.

Figure 10:
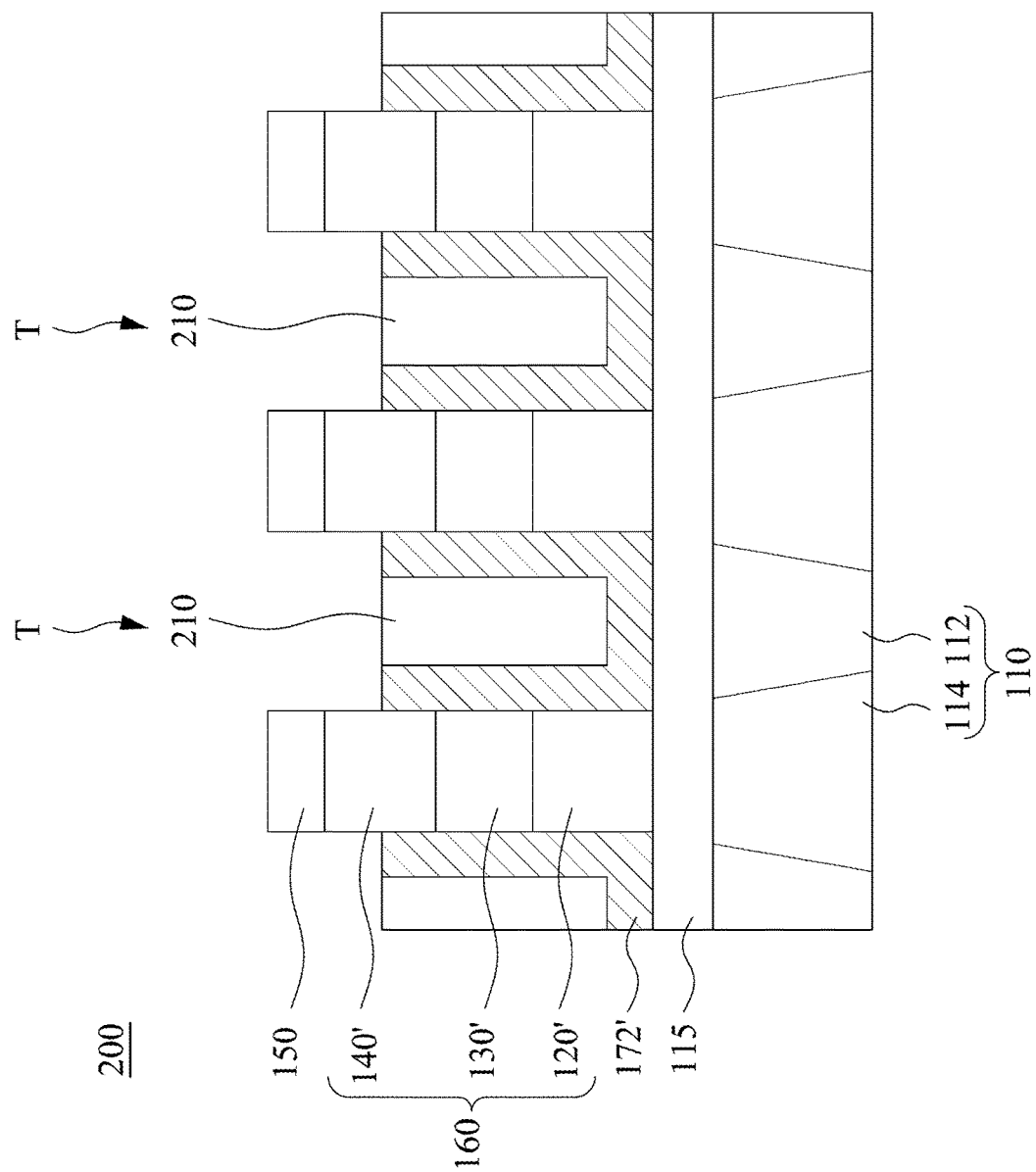

Referring to FIG. 10, portions of the first spacer layer 170 on the top surfaces of the multilayer stacks 160 are removed and portions of the first spacer layer 170 adjacent to sidewalls of the multilayer stacks 160 are etched back to form first spacers 172' along the sidewalls of the multilayer stacks 160 and over the semiconductor structure 110. The first spacer layer 170 is etched until the top surfaces of the first spacers 172' are leveled with the top surface of the sacrificial layer 210. Therefore, the first spacers 172' have top surfaces higher than the top surface of the patterned conductive layer 130' and lower than the top surface of the patterned second dielectric layer 140'. Stated another way, the first spacers 172' cover the sidewalls of the patterned conductive layer 130' and the patterned second dielectric layer 140' after the first spacer layer 170 is etched.

Figure 11:
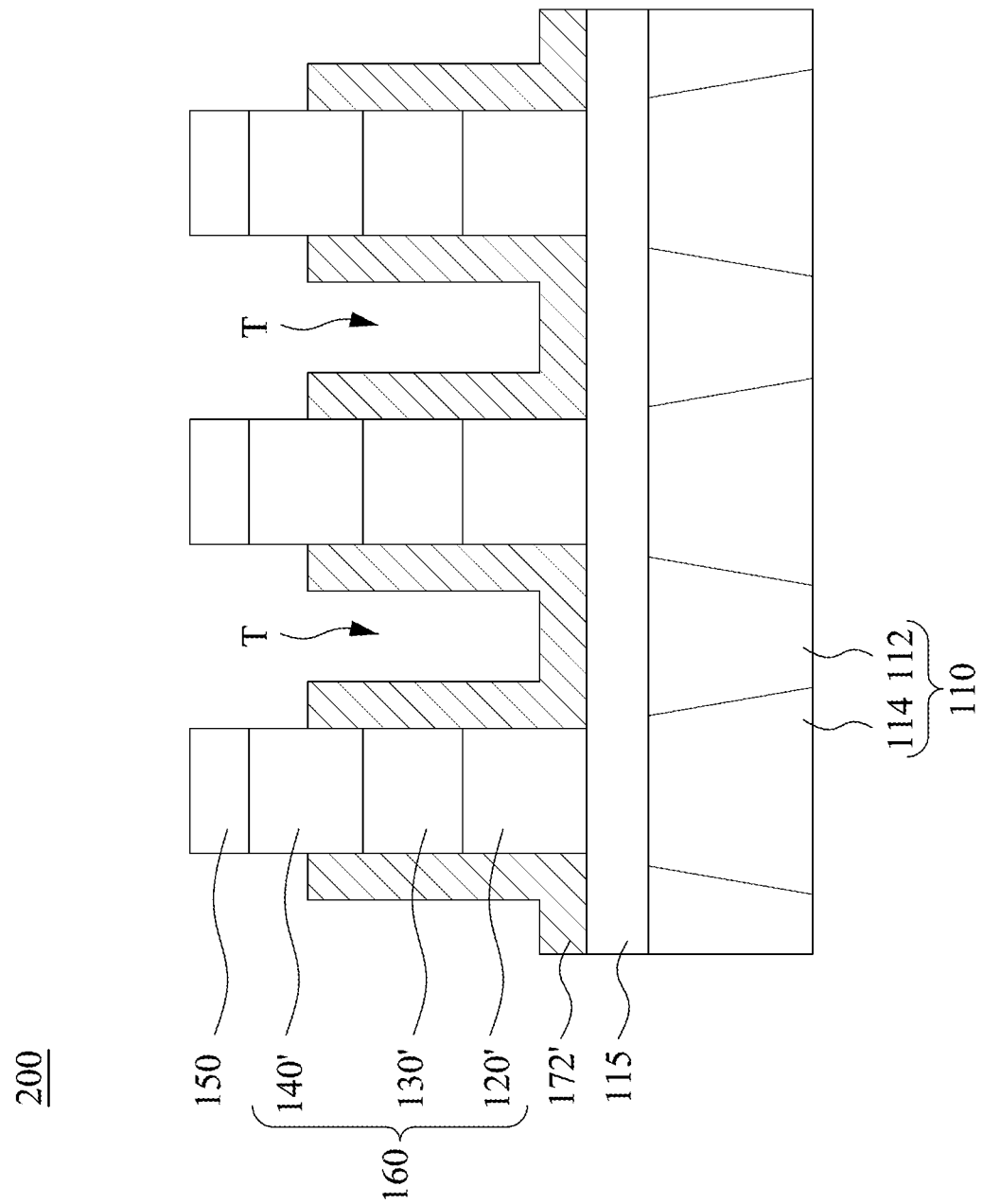

Referring to FIG. 11, the sacrificial layer 210 is removed, so the portions of the unetched first spacer layer 170 (i.e. the first spacers 172') remain in the semiconductor device 200. The sacrificial layer 210 may be removed by any suitable process. In some embodiments, the sacrificial layer 210 is removed by a selective etching process in which the sacrificial layer 210 is etched but the first spacers 172' is not etched or barely etched compared to the sacrificial layer 210. Alternatively, the sacrificial layer 210 is etched at a faster rate compared to the first spacers 172' during the selective etching process. In this operation, the portions of the first spacers 172' over the top surface of the semiconductor structure 110 remain in place.

Figure 12:
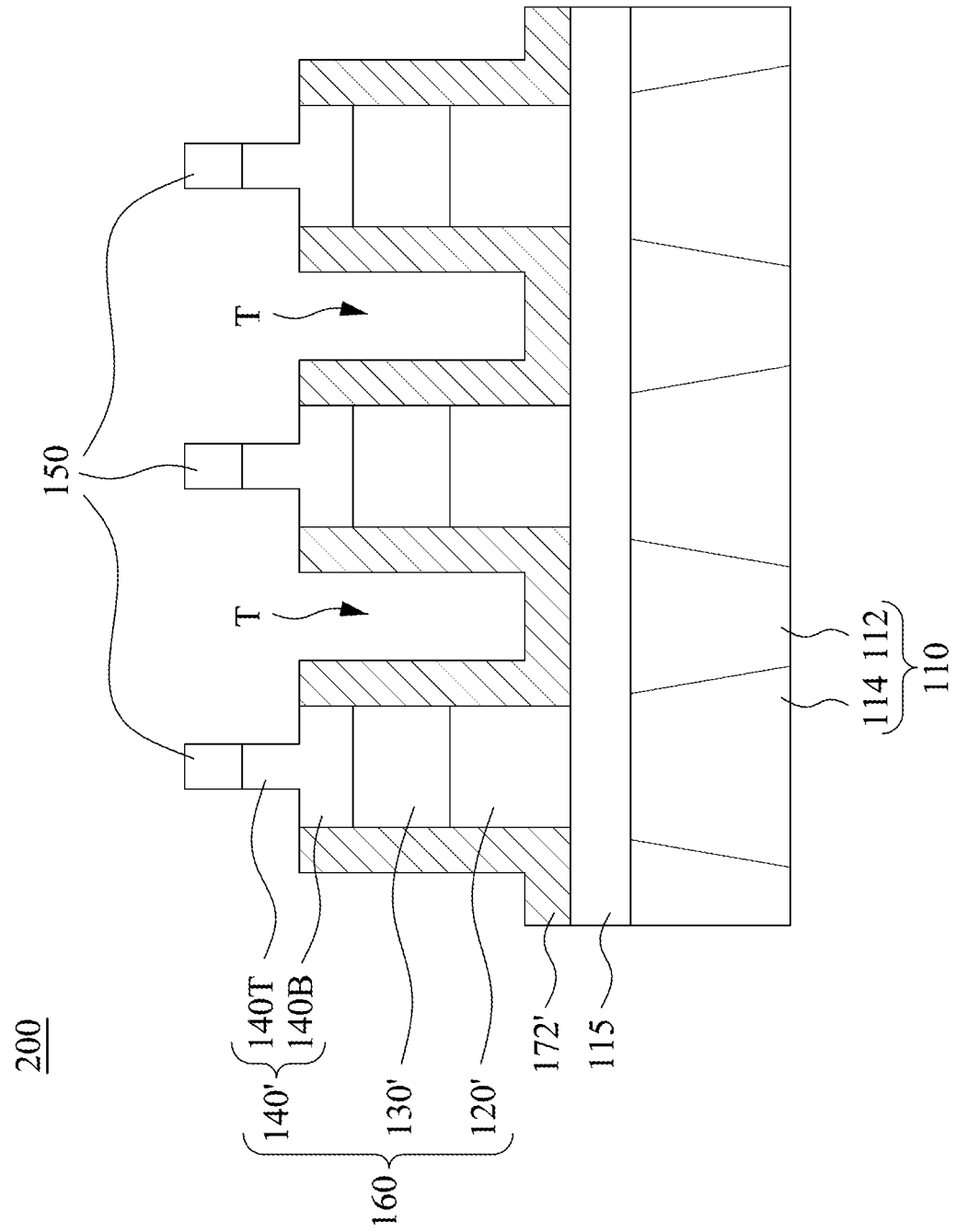

Referring to FIG. 12, the patterned second dielectric layers 140' are laterally etched by the first spacers 172' to form a top portion 140T and a bottom portion 140B in each of the patterned second dielectric layers 140'. After the patterned second dielectric layers 140' are laterally etched, the bottom portion 140B has a width wider than that of the top portion 140T, which is similar to FIG. 6. The narrower top portion 140T makes top portions of the trenches T between the adjacent multilayer stacks 160 become wider and reduce the aspect ratio of the trenches, which makes the contacts more easily to be formed in the trenches T. Details related to the etching process in FIG. 12 are similar to or the same as the etching process in FIG. 6; therefore, detailed descriptions are not discussed herein.

Figure 13:
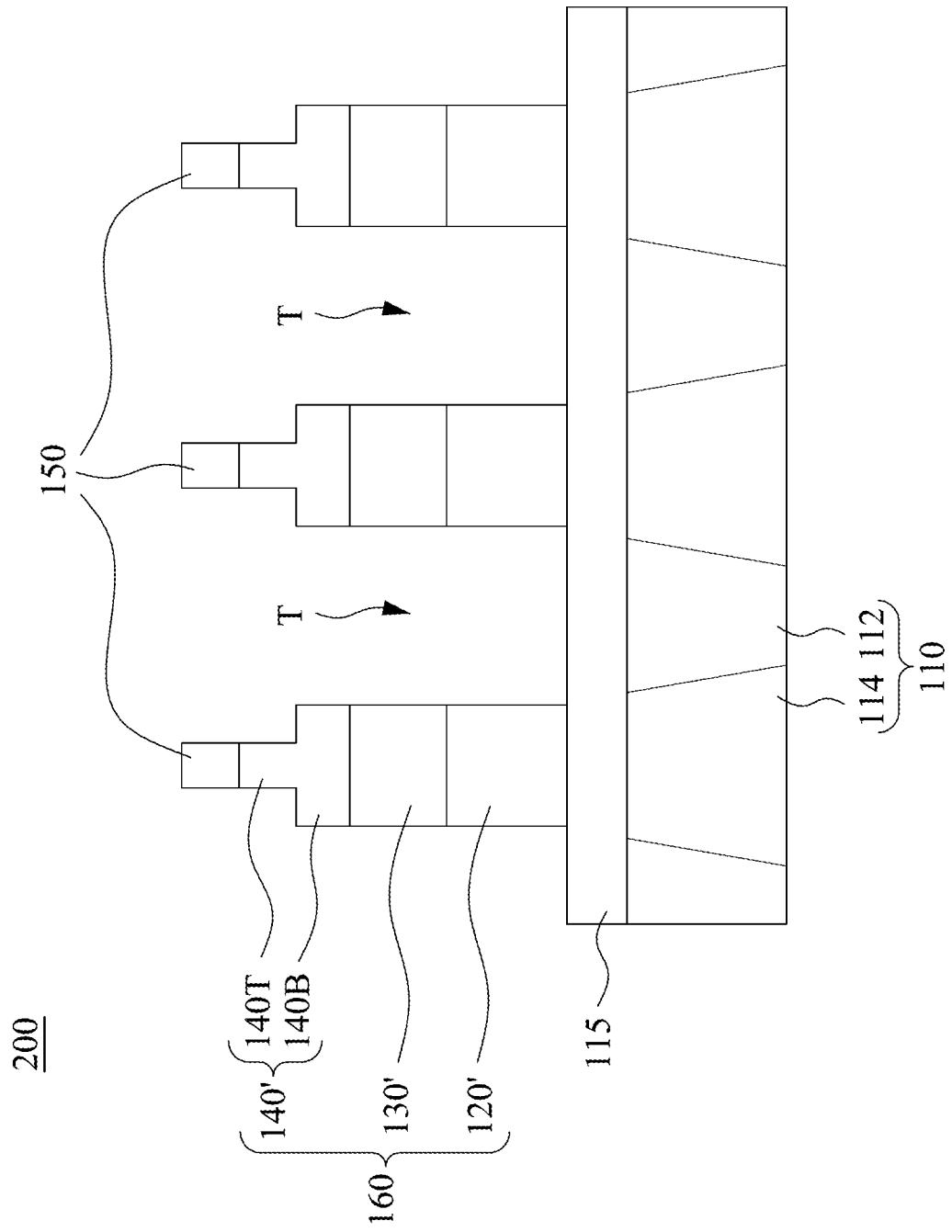

Referring to FIG. 13, the first spacers 172' are removed. In some embodiments, the first spacers 172' are removed by selective etching process, in which the first spacers 172' are removed but the multilayer stacks 160 remain in place. After removing the first spacers 172', the trenches T still have a wide portion respectively, thereby reducing the aspect ratio and making the contacts more easily to be formed in the trenches T.

Figure 14:
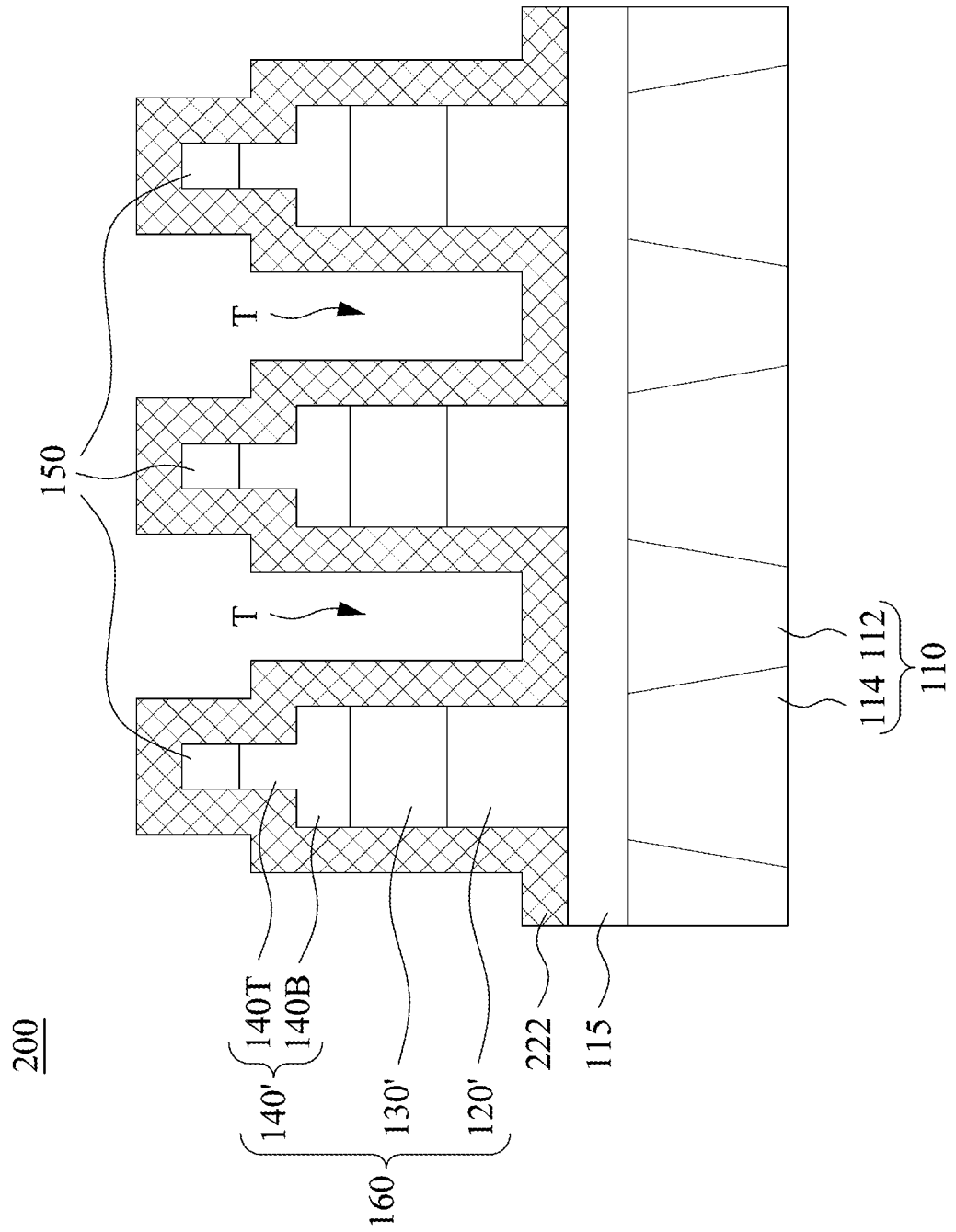

Referring to FIG. 14, a second spacer layer 220 is conformally formed over the multilayer stacks 160 and the semiconductor structure 110. In some embodiments, the second spacer layer 220 may be made of the same material as the first spacer layer 170, while the second spacer layer 220 may also be made of different materials from the first spacer layer 220 in other embodiments. Details related to the process in FIG. 14 are similar to or the same as the process in FIG. 4; therefore, detailed descriptions are not discussed herein.

Figure 15:
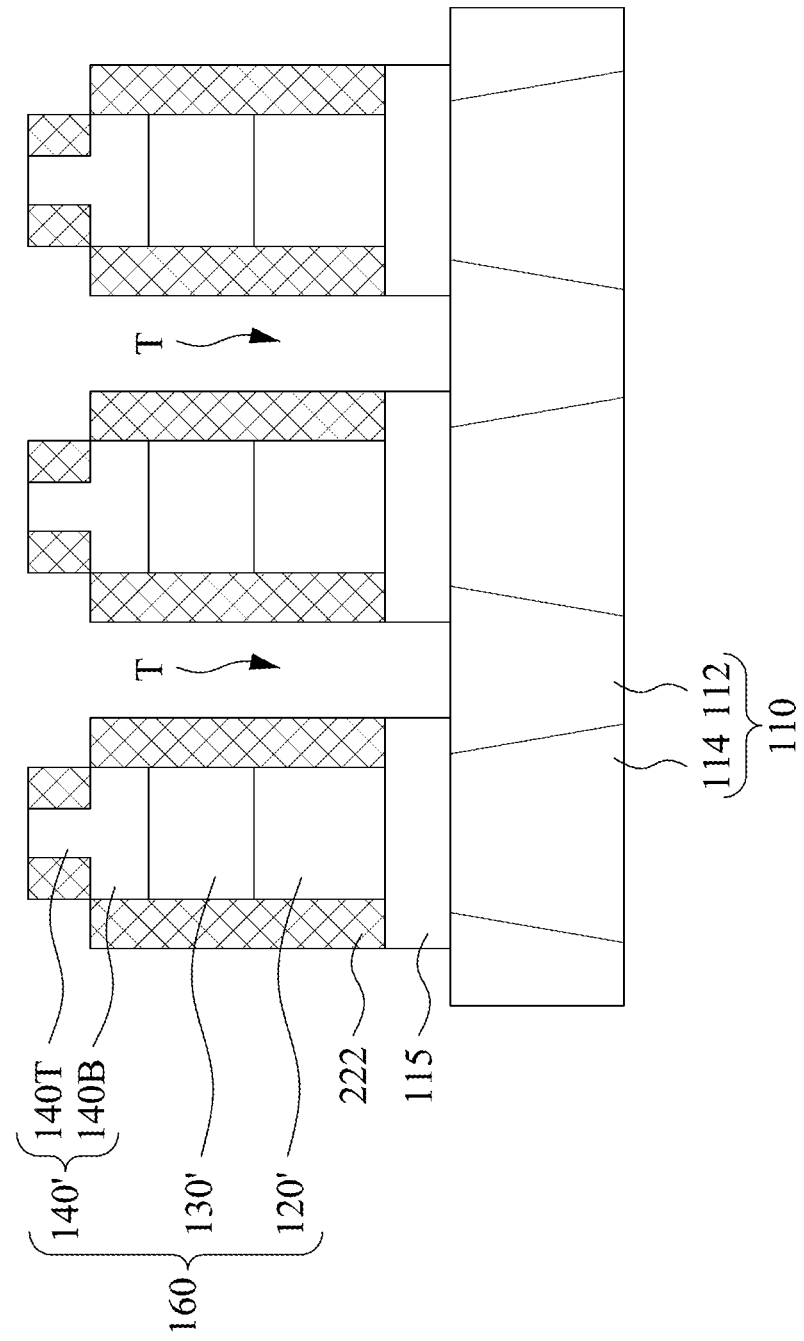

Referring to FIG. 15, portions of the second spacer layer 220 on the top surfaces of the multilayer stacks 160 are removed and portions of the second spacer layer 220 adjacent to sidewalls of the multilayer stacks 160 are etched back to form second spacers 222 along the sidewalls of the multilayer stacks 160. The second spacer layer 220 may be partially removed to form the second spacers 222 by any suitable process, such as dry etching or wet etching. After partially removing the second spacer layer 220, the second spacers 222 substantially entirely cover the sidewalls of the multilayer stacks 160. In some embodiments, the patterned resist layer 150 (see FIG. 14) is also removed during using the etching process to partially remove the second spacer layer 220. The second spacers 222 provide electrical isolation between the multilayer stacks 160 and the subsequently formed contacts. Although the second spacers 222 entirely cover the sidewalls of the multilayer stacks 160, the trenches T between the multilayer stacks 160 still have the wide top portions, the subsequently formed contacts are easily to be formed in the trenches T accordingly.

Figure 16:
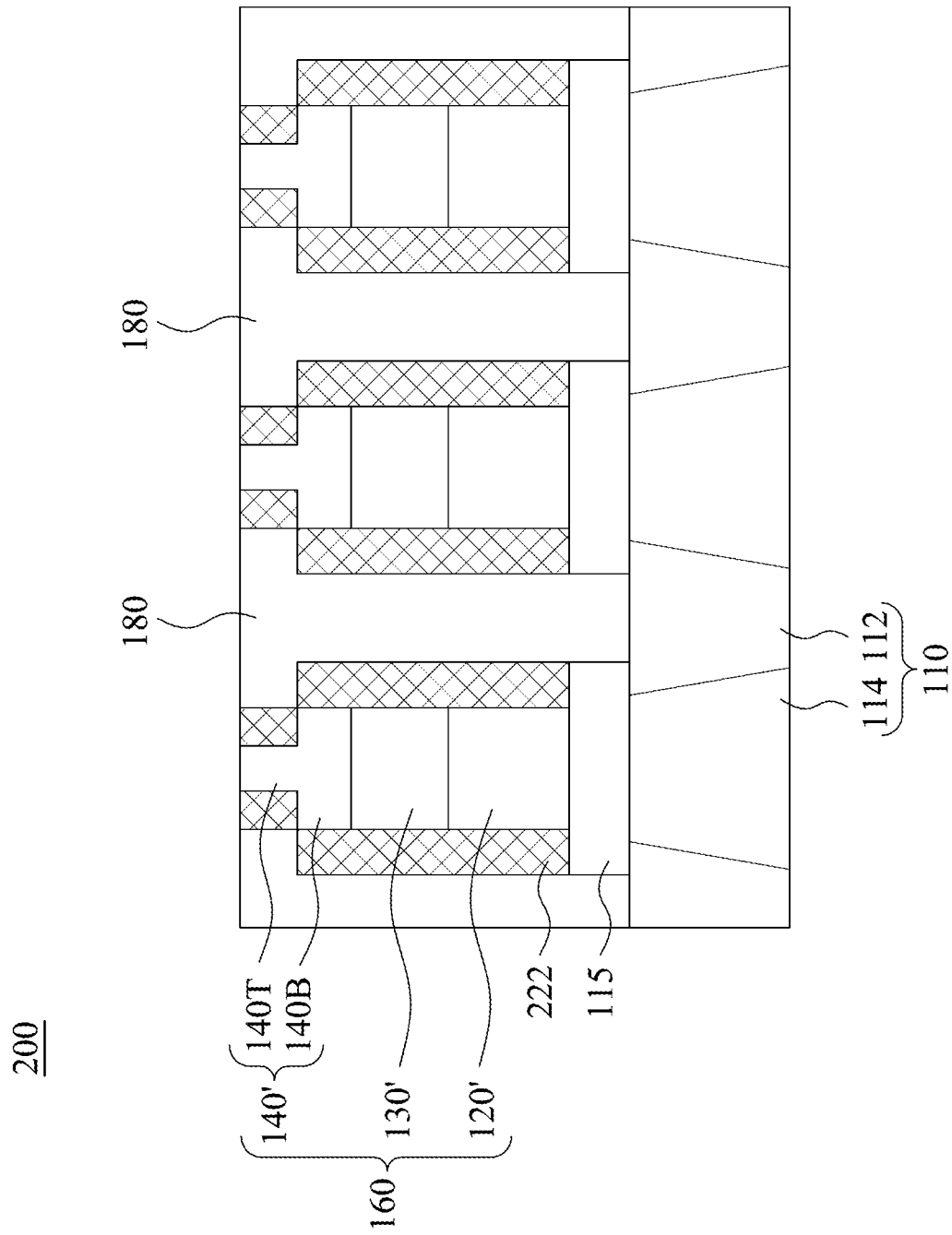
Figure 17:
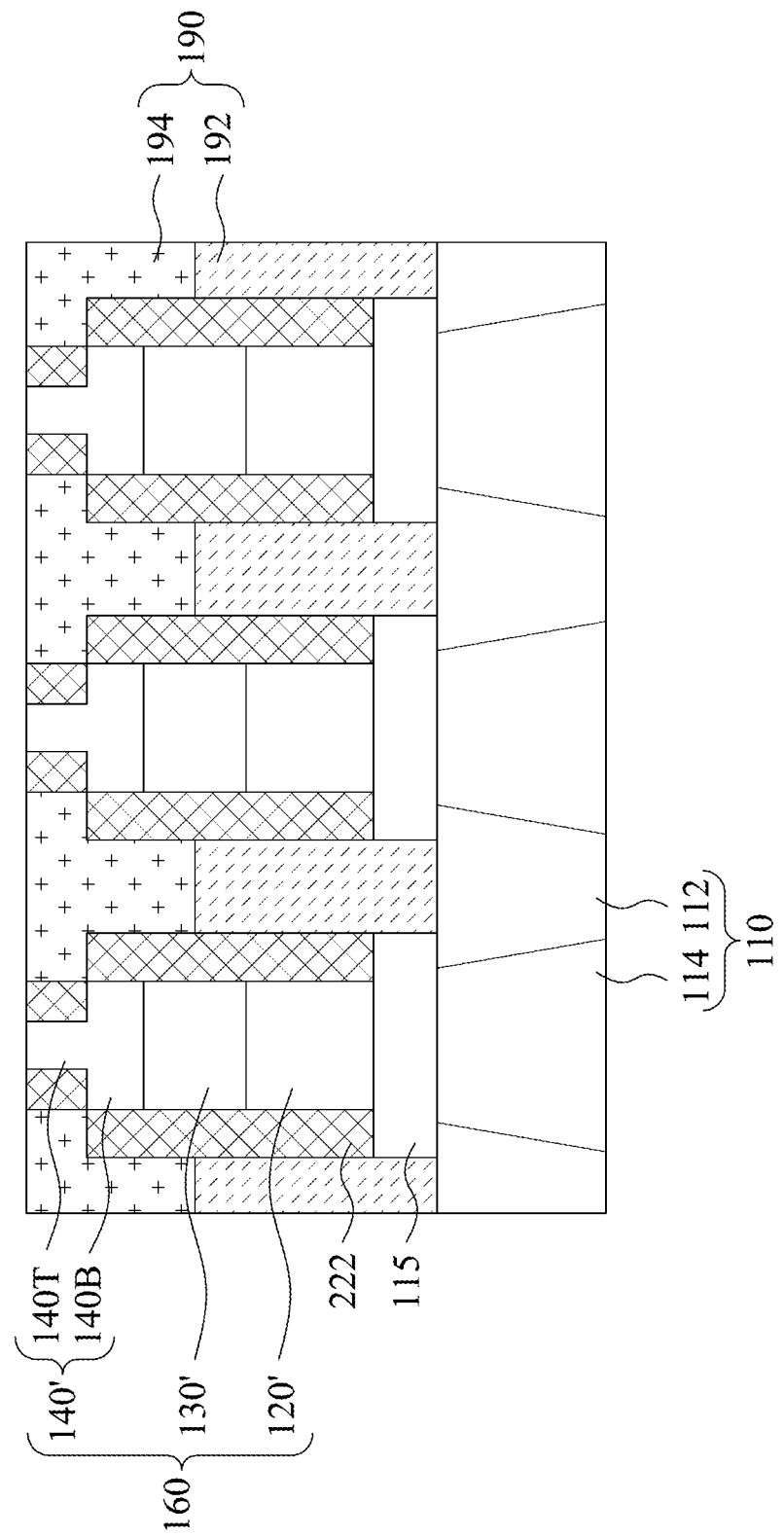

Next, contacts are formed in the trenches T between the adjacent multilayer stacks 160. In some embodiments, the contacts are made of a single material, such as the contacts 180 shown in FIG. 16. In some other embodiments, the contacts are made of two or more different materials, such as the contacts 190 shown in FIG. 17. Details related to the process of forming the contacts in FIGS. 16 and 17 are similar to or the same as the process of forming the contacts in FIGS. 7 and 8; therefore, detailed descriptions are not discussed herein. In some embodiments shown as FIG. 16 and FIG. 17, the second spacers 220 are in contact with a top surface of the bottom portion 140B of the patterned second dielectric layer 140' in the multilayer stacks 160.

The manufacturing process of the aforementioned embodiments of the present disclosure can easily form the contacts with less voids in the semiconductor structure. In addition, the thickness of the components in the bitlines is not reduced, so the components in the bitlines are not be affected by the manufacturing process of the contacts and still can function well after the formation of the contacts.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor device, comprising: a semiconductor structure comprising conductive features therein; a first dielectric layer on the semiconductor structure; and a plurality of multilayer stacks arranged on the first dielectric layer, wherein each of the multilayer stacks comprises: a semiconductor layer over the first dielectric layer; a conductive layer over the semiconductor layer; and a second dielectric layer over the conductive layer, wherein the second dielectric layer comprises a top portion and a bottom portion wider than the top portion; further comprising spacers along sidewalls of the multilayer stacks; wherein top surfaces of the spacers are lower than a top surface of the second dielectric layer and higher than a top surface of the conductive layer.

2. The semiconductor device of claim 1, wherein a width of the top portion of the second dielectric layer is 40% to 70% of a width of the bottom portion of the dielectric layer.

3. The semiconductor device of claim 1, further comprising a contact between two of the multilayer stacks.

4. The semiconductor device of claim 3, wherein the contact penetrates the first dielectric layer and is in contact with one of the conductive features.

5. The semiconductor device of claim 3, wherein the contact comprises tungsten.

6. The semiconductor device of claim 3, wherein the contact comprises:
    a bottom portion comprising poly-crystalline silicon; and
    a top portion comprising tungsten.

7. The semiconductor device of claim 3, wherein the contact is in contact with the top portion of the second dielectric layer.

8. The semiconductor device of claim 1, wherein the spacers are in contact with a top surface of the bottom portion of the second dielectric layer.

9. A manufacturing method of a semiconductor device, comprising: forming a first dielectric layer over a semiconductor structure, wherein the semiconductor structure comprises a conductive feature; sequentially forming a semiconductor layer, a conductive layer, and a second dielectric layer on the first dielectric layer; forming a patterned resist layer on the second dielectric layer; patterning the second dielectric layer, the conductive layer and the semiconductor layer by using the patterned resist layer as an etching mask to form multilayer stacks, wherein each of the multilayer stacks comprises a patterned semiconductor layer, a patterned conductive layer and a patterned second dielectric layer from bottom to top; and performing an etching process to laterally etch a portion of the patterned second dielectric layer such that a width of a top portion of the etched second dielectric layer is less than a width of a bottom portion of the patterned second dielectric layer, wherein performing the etching process to laterally etching the portion of the patterned second dielectric layer comprises: forming a first spacer layer over the semiconductor structure and the multilayer stacks; etching back the first spacer layer to expose the portion of the patterned second dielectric layer; and after etching back the first spacer layer, laterally etching the portion of the patterned second dielectric layer to form the top portion of the etched second dielectric layer and the bottom portion of the patterned second dielectric layer.

10. The manufacturing method of claim 9, wherein etching back the spacer layer comprises etching the spacer layer to a height lower than a top surface of the patterned second dielectric layer and higher than a top surface of the patterned conductive layer.

11. The manufacturing method of claim 9, wherein portions of the first dielectric layer are etched to expose the conductive features in the semiconductor structure during etching back the spacer layer.

12. The manufacturing method of claim 9, further comprising forming contacts between the multilayer stacks after laterally etching the portion of the patterned second dielectric layer.

13. The manufacturing method of claim 12, wherein forming the contacts comprises: filling a first material in a trench between the multilayer stacks; etching back the first material; and filling a second material in the trench and on the etched first material.

14. The manufacturing method of claim 9, wherein etching back the spacer layer to expose the portion of the patterned second dielectric layer comprises: forming a sacrificial layer in a trench between the multilayer stacks, wherein a top surface of the sacrificial layer is higher than a top surface of the patterned conductive layer and lower than a top surface of the patterned second dielectric layer; etching a top portion of the spacer layer exposed from the sacrificial layer; and removing the sacrificial layer after etching the top portion of the spacer layer.

15. The manufacturing method of claim 9, further comprising: removing the first spacer layer after laterally etching the patterned second dielectric layer; conformally forming a second spacer layer on the multilayer stacks and the first dielectric layer; and etching the second spacer layer and the first dielectric layer to expose the conductive feature in the semiconductor structure.

16. The manufacturing method of claim 9, further comprising removing the patterned resist layer after performing the etching process.

17. The manufacturing method of claim 9, wherein the etching process to etch the patterned second dielectric layer is performed by using an isotropic etching process.

* * * * *